United States Patent
Watson

(10) Patent No.: US 8,304,276 B2
(45) Date of Patent: Nov. 6, 2012

(54) FILM STRESS MANAGEMENT FOR MEMS THROUGH SELECTIVE RELAXATION

(75) Inventor: George Patrick Watson, Avon, NJ (US)

(73) Assignee: Alcatel Lucent, Paris (FR)

( * ) Notice: Subject to any disclaimer, the term of this patent is extended or adjusted under 35 U.S.C. 154(b) by 0 days.

(21) Appl. No.: 13/358,615

(22) Filed: Jan. 26, 2012

(65) Prior Publication Data

US 2012/0122300 A1   May 17, 2012

Related U.S. Application Data

(62) Division of application No. 11/968,399, filed on Jan. 2, 2008, now Pat. No. 8,138,495.

(51) Int. Cl.
*H01L 21/00* (2006.01)
(52) U.S. Cl. ............... 438/52; 438/938; 257/E21.125
(58) Field of Classification Search .............. 438/48, 438/52; 257/17, 254, E21.125, E21.317; 74/141.5
See application file for complete search history.

(56) References Cited

U.S. PATENT DOCUMENTS

| 6,515,382 B1 | 2/2003 | Ullakko |
| 2004/0137735 A1 | 7/2004 | Sakai et al. |

OTHER PUBLICATIONS

Aksyuk, V.A., et al., "Beam-Steering Micromirrors for Large Optical Cross-Connects", J. Lightwave Tech. 21, 634, 2003.
Xie, H., et al., "A CMOS-MEMS Mirror with Curled-Hinge Comb Drives", J. Microelectromech. Syst., 12, 450, 2003.
Vaccaro, P.O., et al., "Strain-driven self-positioning of micromachined structures", Appl. Phys. Lett., 78, 2852, 2001.
Huand, M., et al., "Nanomechanical Architecture of Strained Bilayer Think Films: From Design Principles to Experimental Fabrication", Adv. Mater. 2005.
Pister, K.S., et al., "Microfabricated Hinges", Sensors and Actuators A, 33, 249, 1992.
Tokuda, T., et al., "Fabrication and current-drive of SiGe/Si 'Micro-Origami' epitaxial MEMS device on SOI substrate", Electron. Lett., 40, 2004.
Frank, F.C., et al., "One-dimensional dislocations. Misfitting monolayers and oriented overgrowth"; Proc. Roy. Soc. A, 198, 216, 1949.
Matthews. J. W., et al., "Defects in epitaxial multilayers", J. Cryst. Growth, 27, 118, 1974.
Fitzgerald, E.A., et al., "Nucleation mechanisms and the elimination of misfit dislocations at mismatched interfaces by a reduction of growth area", J. appl. Phys., 65, 2220, 1989.
Watson, G.P., et al., Appl. Phys. Lett. 58, 2517, (1991).
Watson, G.P., et al., "The barrier to misfit dislocation glide in continuous, strained, epitaxial layers on patterned substrates", J. Appl. Phys., 74, 3103, 1993.
Watson, G.P., et al.,"The Isolation and Nucleation of Misfit Dislocations in Strained Epitaxial Layers Grown on Patterned, Ion-Damaged GaAs"; Journal of Electronic Materials, vol. 19, No. 9, 1990; pp. 957-965.
Watson, G.P., et al. "Controlled misfit dislocation nucleation in SiGe epitaxial layers grown on Si", Appl. Phys. Lett., 63, 746, 1993.
Eshelby, J.D., "Dislocations in Thin Rods", J. Appl. Phys., 24, 176, 1953.
Kightley, P., et al. "A mechanism of misfit dislocation reaction for GaInAs strained layers grown onto off-axis GaAs substrates", Journal of Crystal Growth 112, (1991); pp. 359-367.
Watson, G.P., et al., "Misfit Dislocation interactions observed by cathodoluminescence in InGaAs on off-cut, patterned GaAs", 94, 1513, 2003.
Parent case—U.S. Appl. No. 11/968,399, filed Jan. 2, 2008, to George Watson, entitled "Film Stress Management for MEMS Through Selective Relaxation", 35 pages.

*Primary Examiner* — Leonard Chang
(74) *Attorney, Agent, or Firm* — Hitt Gaines, PC

(57) ABSTRACT

An apparatus comprising a microelectromechanical system. The microelectromechanical system includes a crystalline structural element having dislocations therein. For at least about 60 percent of adjacent pairs of the dislocations, direction vectors of the dislocations form acute angles of less than about 45 degrees.

11 Claims, 14 Drawing Sheets

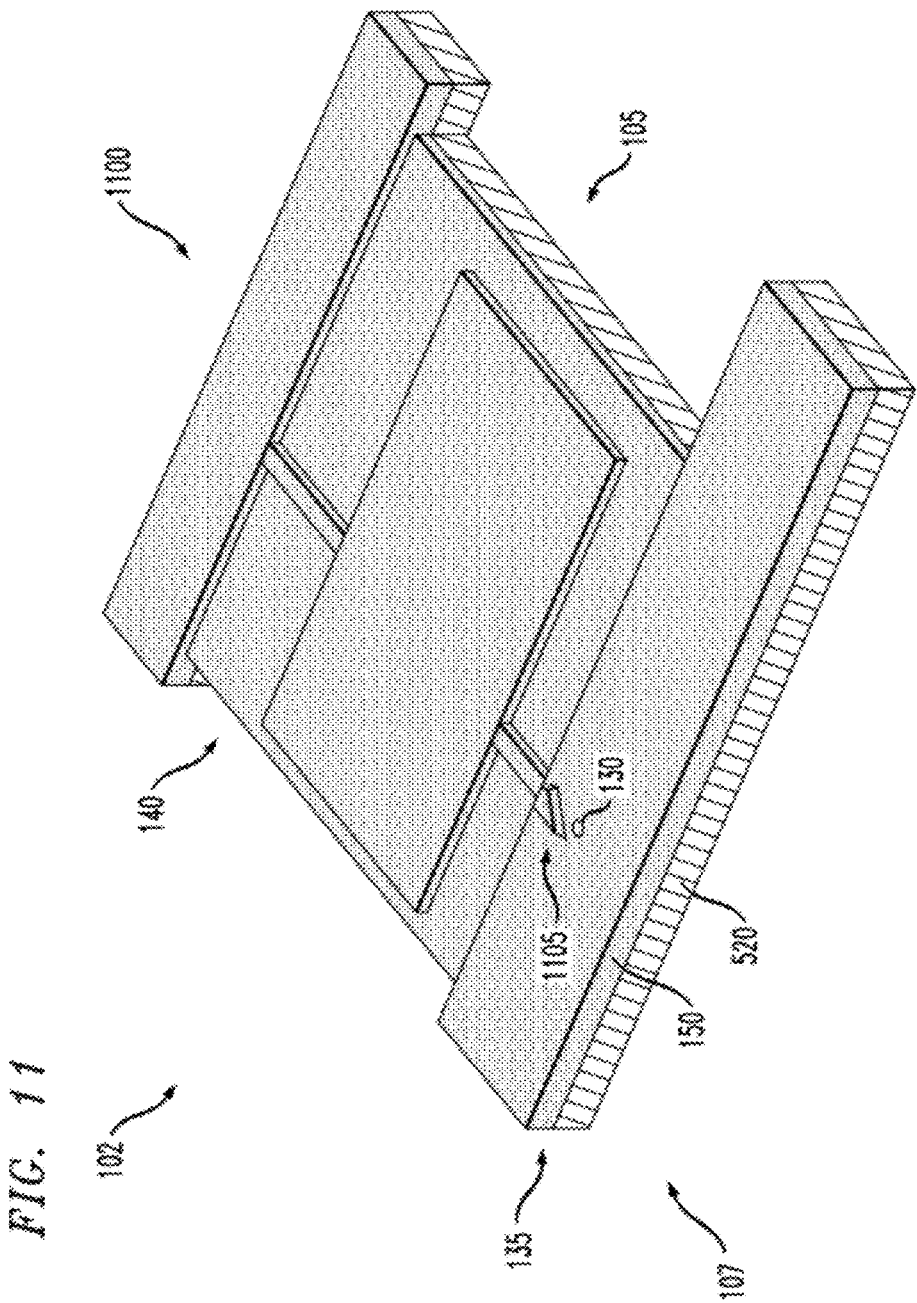

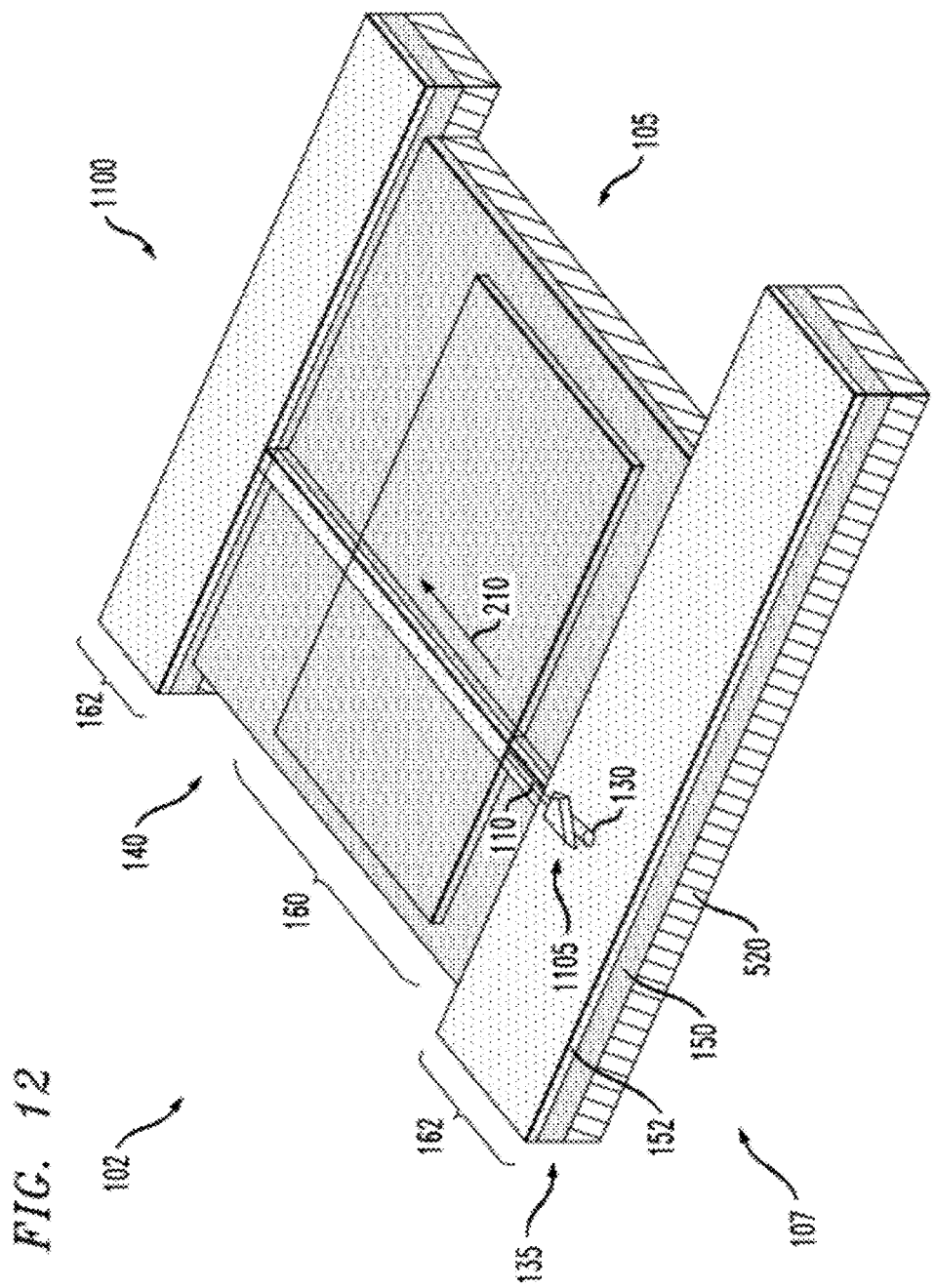

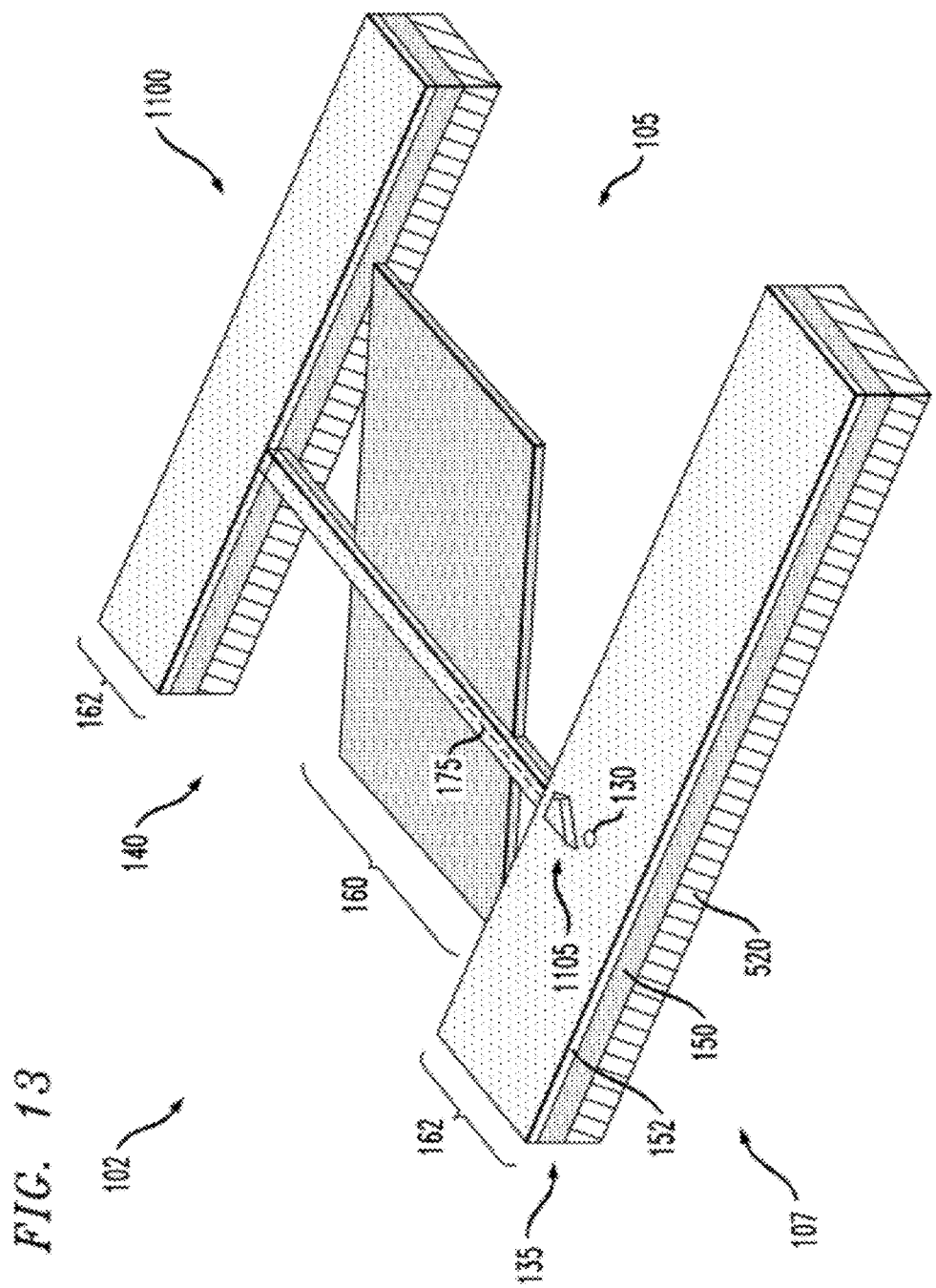

FILM STRESS MANAGEMENT FOR MEMS THROUGH SELECTIVE RELAXATION

CROSS-REFERENCE TO RELATED APPLICATIONS

This Application is a Divisional of U.S. application Ser. No. 11/968,399 filed on Jan. 2, 2008, now U.S. Pat. No. 8,138,495 to George Watson, entitled "FILM STRESS MANAGEMENT FOR MEMS THROUGH SELECTIVE RELAXATION," currently allowed; commonly assigned with the present invention and incorporated herein by reference.

TECHNICAL FIELD OF THE INVENTION

The present disclosure is directed, in general, to an apparatus that comprises a microelectromechanical system (MEMS) and method of manufacture thereof.

BACKGROUND OF THE INVENTION

MEMS can include parts (structural elements) that are above, below or in the plane of a substrate, to form three-dimensional features. The MEMS's structural elements, in their final form, can be configured to be straight or bent. To improve the yield and performance of the MEMS, it is desirable to be able to form such MEMS structural elements into reproducible shapes. For instance, it is sometimes desirable for a MEMS manufacturing process to form batches of MEMS having bent structural elements that are all bent in the same position and to the same degree, or, having straight elements that all have the same extent of straightness. To obtain reproducible performance, it is also sometimes desirable for bent structural elements to remain bent and for straight elements to remain straight throughout the operational lifetime of the MEMS.

SUMMARY OF THE INVENTION

One embodiment is an apparatus comprising a microelectromechanical system. The microelectromechanical system includes a crystalline structural element having dislocations therein. For at least about 60 percent of adjacent pairs of the dislocations, direction vectors of the dislocations form acute angles of less than about 45 degrees Another embodiment is a method of manufacturing an apparatus that comprises forming a microelectromechanical system having a crystalline structural element. Forming the microelectromechanical system includes providing a substrate having a first crystal layer located thereon and patterning the first crystal layer to form a lattice dislocation blocking feature. One or more nucleation sites are formed in the blocking feature. Forming the microelectromechanical system also includes forming one or more nucleation sites in the lattice dislocation blocking feature, and covering the first crystal layer with a second crystal layer. The first crystal layer and the second crystal layer have bulk lattice constants that differ by at least 0.1 percent. Misfit dislocations form at an interface between the first crystal layer and the second crystal layer. At least about 60 percent of adjacent pairs of the misfit dislocations have direction vectors that form acute angles of less than about 45 degrees.

BRIEF DESCRIPTION OF THE DRAWINGS

The embodiments of the disclosure are best understood from the following detailed description, when read with the accompanying FIGUREs. Corresponding or like numbers or characters indicate corresponding or like structures. Various features may not be drawn to scale and may be arbitrarily increased or reduced in size for clarity of discussion. Reference is now made to the following descriptions taken in conjunction with the accompanying drawings, in which:

FIG. 2A presents a plan of a portion of the second example apparatus;

FIGS. 11-13 present perspective views of selected steps in a second example method of manufacturing an apparatus, e.g., as in FIGS. 1-4.

DETAILED DESCRIPTION

The present disclosure benefits from the recognition that the yield and performance of MEMS structures can be worsened by the presence of naturally occurring line defects, called dislocations. In the MEMS manufacturing industry, line defects are generally considered to be undesirable because such defects can cause the malfunction of the MEMS. For instance, misfit dislocations can form randomly at the interface between strained structural elements of the MEMS. Such misfit dislocations can cause random and non-uniform stress relaxation of the structural elements, which in turn, can cause random and non-uniform changes in the shape of the structural element from one MEMS to the next MEMS in a batch fabrication process. For these reasons, steps are often taken to prevent or reduce the formation of line defects in the structural elements of MEMS structures.

This is in contrast to the present disclosure, which recognizes that the intentional and controlled promotion of line defects (for example, misfit or edge dislocations) can be used to control strain formation and relaxation in MEMS structural elements. Indeed, the present disclosure recognizes that the combination of selective relaxation processes, such as defect nucleation and dislocation blocking, are new result-effective variables for controlling the shape and/or stiffness of the structural elements.

Figure 1:
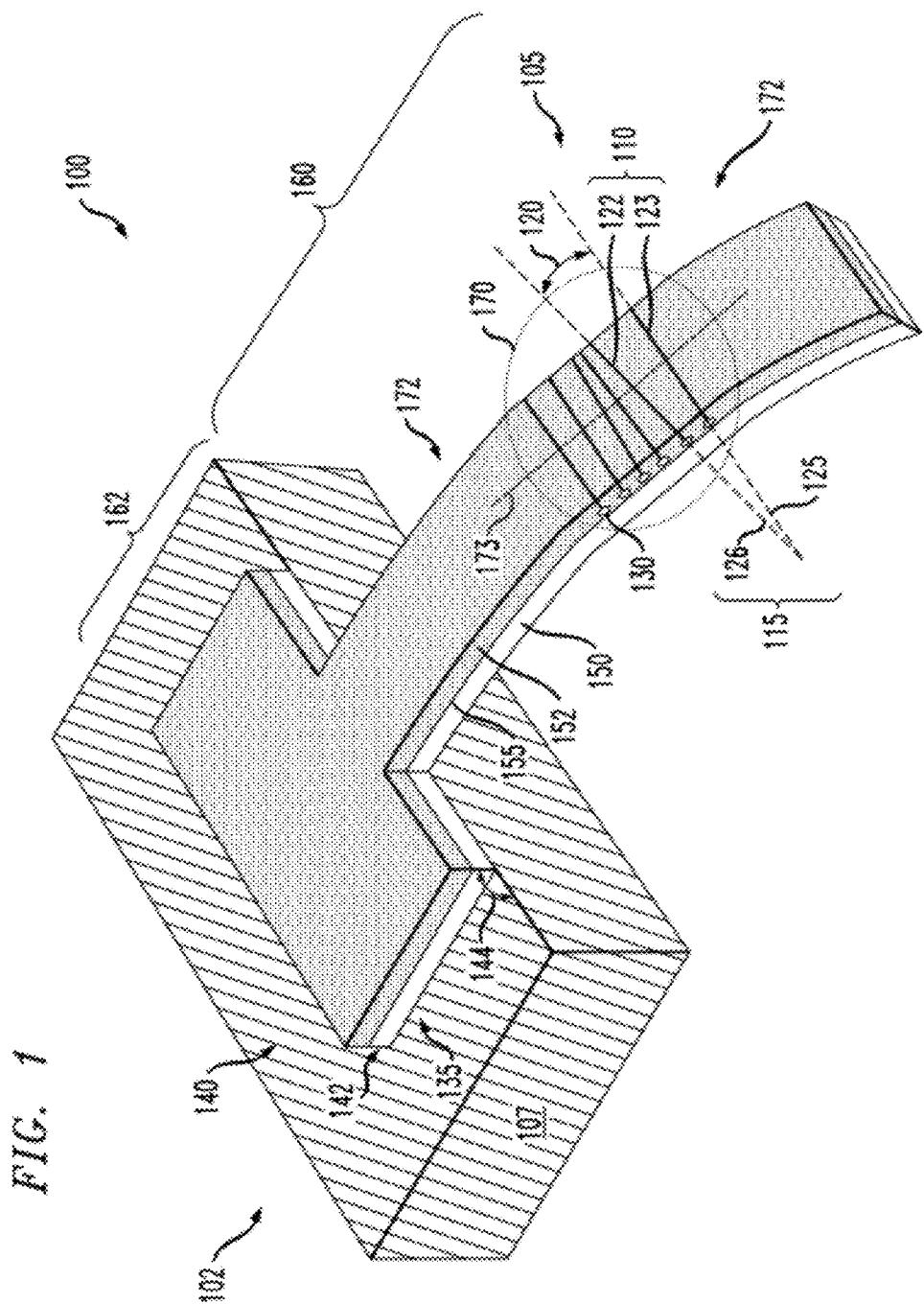
FIG. 1 presents a perspective view of a portion of an example apparatus having a MEMS therein.

One embodiment is an apparatus that comprises a MEMS. FIG. 1 shows a perspective view of an example apparatus 100 and a portion of a MEMS 102. In some embodiments, the apparatus 100 is configured as an optoelectronic component, such as a receiver or transmitter apparatus that implements adaptive optics or spatial light modulation. The MEMS can have linear dimensions in a sub-micron to millimeter-sized range and can perform mechanical, electrical, fluidic, optical, acoustic, magnetic, or other functions well know to those skilled in the art. Example configurations of the MEMS 102 include a mirror, a spring, or a structural support member.

The MEMS 102 includes a crystalline structural element 105. The crystalline structural element 105 can be a component that moves during the MEMS's 102 normal operation, or a non-moving component. As shown in FIG. 1, the crystalline structural element 105 is located on a substrate 107. The crystalline structural element 105 has dislocations 110 therein. The crystalline structural element 105 is composed of a single crystal layer or a plurality of single crystal layers. Amorphous or polycrystalline materials are not preferred because the stresses in such materials are hard to control or maintain throughout various process steps to form a structural element into its pre-designed final shape.

The term dislocation 110 as used herein refers to substantially linear defects that are located at the interface between two strained crystal layers. The dislocation can be an edge dislocation or a misfit dislocation. Edge dislocations refer to a discontinuity in the otherwise ideal stacking of atoms in a crystal (e.g., a step). Misfit dislocations originate due to a difference (for example, an at least about 0.1% difference) in the lattice constants of the two crystal layers. A misfit dislocation can be an isolated row of broken bonds along the interface between two such layers. The row of broken bonds could be reconstructed, with the misfit dislocation comprising two partial dislocations and a stacking fault, or in some cases, a hollow tube. Two or more misfit dislocations originating at the interface between two crystal layers can initiate the formation of an edge dislocation that penetrates and extends in to one of the crystal layers.

Misfit and edge dislocations can be identified and quantified by inspecting plan or cross-sectional views of transmission electron microscope (TEM) scanning or cathodoluminescence (CL) images of crystal layers. Typically, individual misfit or edge dislocations appear as visible lines in CL images of crystals. Examples of such visualizations are presented in E. A. Fitzgerald, G. P. Watson, R. E. Proano, D. G. Ast, P. D. Kirchner, G. D. Pettit, and J. M. Woodall, "Nucleation mechanisms and the elimination of misfit dislocations at mismatched interfaces by a reduction of growth area", J. Appl. Phys., 65:2220 (1989), which is incorporated by reference herein in its entirety.

A substantial majority (for example, at least about 60 percent, more preferably, for at least about 80 percent, and even more preferably at least about 90 percent) of the dislocations 110 are substantially parallel to each other. For instance, for the majority of dislocations 110, direction vectors 115 for adjacent pairs of dislocations 110 form an acute angle 120 of less than about 45 degrees. More preferably the angle 120 is less than about 20 percent and even more preferably less than about 10 percent. In some embodiments, at least about 80 percent of the adjacent pairs of the dislocations 110 form acute angles 120 of less than about 20 degrees. The term direction vector 115, as used herein, refers to a magnitude-free vector that indicates the direction of propagation of a dislocation 110. The direction of propagation or growth of the dislocation 110 is signified by its direction vector 115. By convention, the direction vectors 115 are taken to form angles 120 of 90 degrees or less herein so that inversion of one of the corresponding two direction vectors 115 does not change the angle 120 between the two direction vectors 115.

FIG. 1 shows an example determination the acute angle 120 between the direction vectors 115 for a pair of dislocations 110. The example dislocations are designated as first and second dislocations 122, 123. The acute angle 120 is determined for the two adjacent dislocations 122, 123 with their respective direction vectors 125, 126 placed at the same origin. It will be apparent to one skilled in the art that two dislocations 110 that are parallel to each other will have an acute angle 120 of about zero, while two dislocations 110 that are perpendicular to each other have an acute angle 120 of 90 degrees.

The direction of propagation of the dislocations 110 can be controlled by the predefined selection of locations to form defect nucleation sites 130 in the crystalline structural element 105. The direction of propagation of the dislocations 110 can be further controlled by blocking the growth of dislocations 110 in undesired directions using lattice dislocation blocking feature 135. A lattice dislocation blocking feature can be a raised or lowered portion of the substrate 107 that is shaped to have an abrupt structural transition above or below the plane of the substrate 107. For instance, the blocking feature can be mesa (a raised feature) or a trench (a lowered feature) having at least one surface that forms an about 90° or −90° angle with respect to the plane of a substrate. Dislocation growth is controlled such that the majority of dislocations, originating from the nucleation sites 130, are substantially parallel to each other, while the blocking features 135 can deter the growth of dislocations 110 in undesired directions.

In some cases, the crystalline structural element 105 includes atoms implanted at nucleation sites 130 of the dislocations 110. The implanted atoms cause local disruptions or damage to the lattice structure of the crystalline structural element 105, which in turn, can promote the formation of dislocations 110. In other cases, the nucleation sites can be formed by other means of creating local disruptions or damage to the crystal lattice structure. Examples include micro- or nano-indentation processes.

In some cases, such as shown in FIG. 1, the crystalline structural element 105 itself can be the blocking feature 135. As shown in FIG. 1, the crystalline structural element 105 is a blocking feature 135, in particular a raised feature, located above a plane 140 of the substrate 107, such that there is an abrupt transition from the substrate 107 to the crystalline structural element 105. A surface 142 of the element forms an angle 144 of about 90° with respect to the substrate's top plane 140. Configuring the crystalline structural element 105 as a blocking feature 135 helps to deter to propagation of the dislocations into the substrate 107 or into non-raised portions of the element 105.

For the embodiment depicted in FIG. 1, the crystalline structural element 105 includes two adjacent single crystal layers 150, 152. Both of the crystal layers 150, 152 can be part of the blocking feature 135. The two crystal layers 150, 152 have different bulk lattice constants. The term bulk lattice constant, as used herein, refers to the lattice constant of a single crystal in the absence of the stress relaxation methods described herein. In some cases the bulk lattice constant can be the asymptotic value of a lattice constant of a single crystal far away from interfaces with other materials. For the embodiment depicted in FIG. 1, the dislocations 110 are misfit dislocations located at an interface 155 between the crystal layers 150, 152.

The crystal layers 150, 152 have substantially different bulk lattice constants. For example, bulk lattice constants can differ by more than about 0.1 percent. In some preferred embodiments, the crystal layers 150, 152 have bulk lattice constants that differ by about 0.1 to 2 percent. In some embodiments, one of the crystal layers 150, 152 is made of silicon and the other of the crystal layers 150, 152 is made of silicon germanium. For crystal layers 150, 152 having bulk lattice constants that differ by less than about 0.1 percent, there may be insufficient strain to cause the formation of misfit dislocations 110. For crystal layers 150, 152 having bulk lattice constants that differ by more than about 4 percent, there may be so much strain that excessive numbers of random misfit dislocations 110 are formed throughout the element 105.

As noted above, the location, number, and propagation direction of the dislocations 110 in the crystalline structural element 105 provides a new set of result-effective variables for controlling the final shape of the element 105. The final shape of the element 105 is adopted when the element 105 is partially released from a substrate 107. For instance, a release process (e.g., a material etch process) that frees part 160 of the element 105 from the substrate can result in a change in the element's 105 shape, as a means reduce residual stresses in the element 105. As shown in FIG. 1, a part 165 of the element can remain fixed to the substrate 107.

The intentionally grown dislocations of the present disclosure are in contrast to naturally occurring dislocations. Naturally occurring disclosures are typically present, in approximately equal numbers, in both substantially parallel (e.g., acute angles of less than about 45 degrees) and substantially perpendicular directions (e.g., acute angles of greater than 45 degree and less than or equal to 90 degrees) with respect to each other. Moreover, the naturally occurring dislocations can appear in random locations in a crystal. Randomly occurring dislocations can cause undesired distortions in the shape of crystals when the crystal is released from the substrate.

For some embodiments of the MEMS 102, such as shown in FIG. 1, the dislocations 110 are localized to one or more defect sub-regions 170 of the crystalline structural element 105. The location of the defect sub-regions 170 helps control where the released part 160 of the element 105 bends. As illustrated in FIG. 1, the released part 160 of the element 105 can bend out of the plane 140 of the substrate 107 with bent portions 172 of the structural element 105 occurring outside of the defect sub-region 170. That is, the presence of a substantial density of substantially parallel dislocations 110 relax stresses in the defect sub-regions 170 reduces the natural tendency of the sub-region 170 to bend when the element 105 is released from the substrate 107. In contrast, the portions 172 of the structural element 105 occurring outside of the defect sub-region 170 bend to release their stresses when the element 105 is released from the substrate 107. Although only two bent portions 172 are depicted in FIG. 1, the element 105 could have one or a plurality of bends that are produced as a consequence of forming a different numbers of defect sub-regions 170.

The term defect sub-region 170, as used herein, refers to that portion of the crystalline structural element 105 having a substantially elevated density of dislocations 110. For instance, the density of dislocations 110 in the defect sub-region 170 can be at least about 2 times higher, and in some cases about 20 or more times higher, than in remaining regions of the element 105. One skilled in the art would understand how to quantify the density of the dislocations 110. For instance, the defect sub-region's 170 total volume, or area at the interface 155, can be quantified by inspecting plan or cross-sectional views of TEM or CL images of the crystalline structural element 105. The number of dislocations 110 within the defect sub-region 170 in these same TEM or CL images can be counted, and the density calculated. Misfit dislocation density can be quantified by counting the number of dislocations that cross a line 173 perpendicular to the dislocation in a defect sub-region 170. For example, in some cases, the misfit dislocation density in some crystalline structural elements 105 can equal about $1 \times 10^5$ cm$^{-1}$, or greater. One skilled in the art would understand how to similarly quantify the density of edge dislocations.

Figure 2:
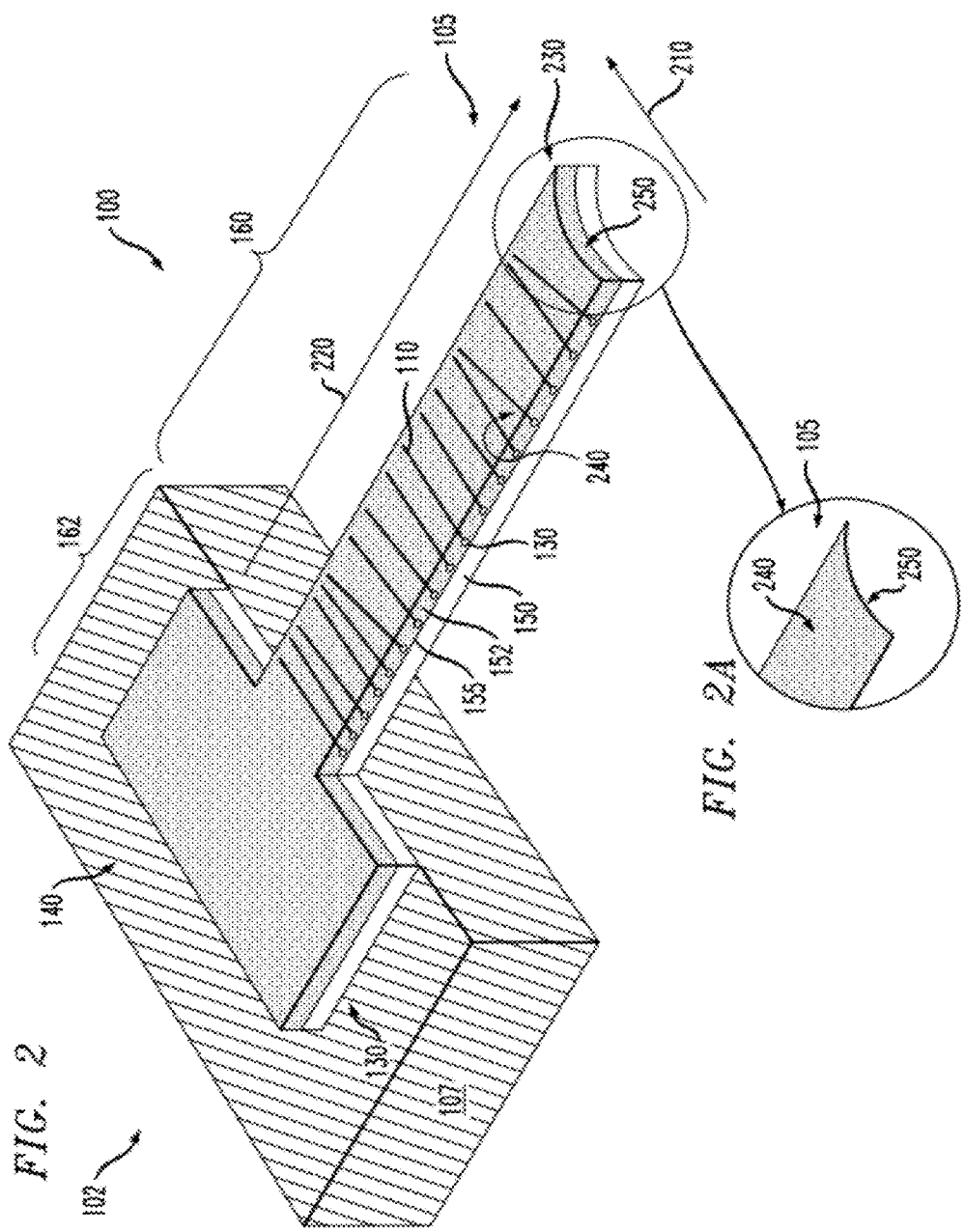
FIG. 2 presents a perspective view of a portion of a second example apparatus and having a MEMS therein.

In other embodiments of the MEMS 102, the dislocations 110 can be distributed throughout the crystalline structural element 105, or at least, the releasable part 160 of the element 105. For example, the density of defects having said adjacent pairs dislocations with the above described acute angle does not vary by more than 50% over the crystalline structural element. The uniform distribution of dislocations 110 can result in a substantially straight or planar element 105. Such an embodiment is shown in FIG. 2, which presents a perspective view of a second example apparatus 100 and MEMS 102 of the present disclosure. The dislocations 110 (e.g., misfit dislocations) run substantially parallel to each other across the short axis 210 (e.g., substantially perpendicular to long axis 220) of the released part 160 of a beam-shaped structural element 105. The misfit dislocations 110 are located substantially at the interface 155 between the two crystal layers 150, 152.

Having unidirectional dislocations 110 throughout the element 105, such as depicted in FIG. 2, can advantageously stiffen the element 105. The relative stiffness of a crystalline structural element 105 can be measured by the comparing voltages needed, in the presence and absence of the dislocations 110, to deflect a structural element 105, for example, configured as a cantilever. The dislocations 110 that travel along the short axis 210 can substantially relax strain along the short axis 210 of the element 105. Consequently, the released part 160 of the element 105 does not bend out of the plane 140 of the substrate 107. In some cases, the element 105 can be stiffer as compared to an identical crystalline structure element of substantially the same composition without the unidirectional misfit dislocations running substantially parallel to the short axis 210.

In some cases, there may still be strain along the long axis 220 of the crystalline structural element 105. One possible consequence of this is illustrated in FIG. 2. The release of part 160 of the element 105 results in slight curling at the tip 230 of the element 105. In such cases, the final shape of the released element 105 can have a substantially planar major side 240 and a curved minor side 250 (see also inset FIG. 2A, showing a plan view of a portion of the crystalline structural element 105).

Figure 3:
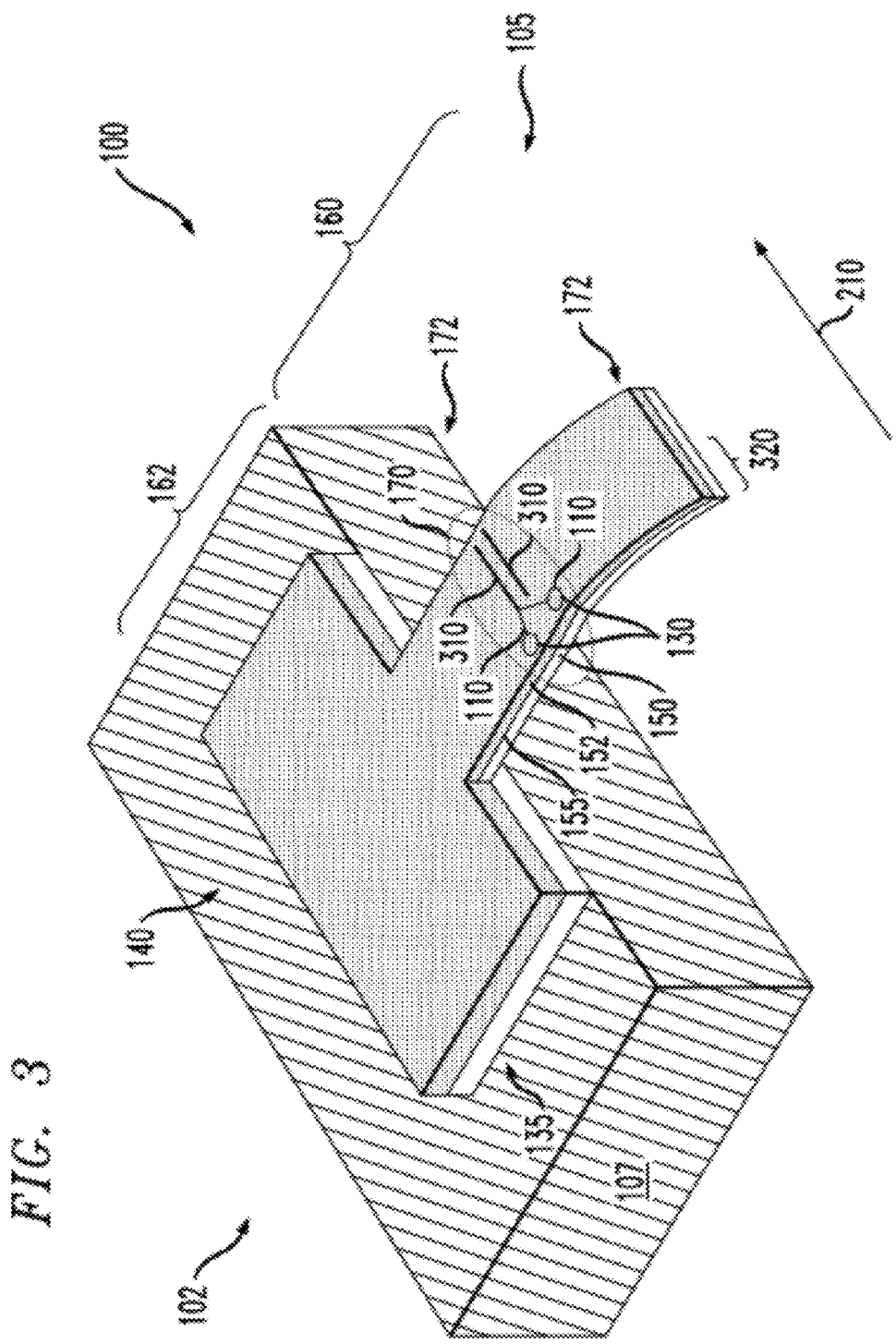
FIG. 3 presents a perspective view of a portion of a third example apparatus having a MEMS therein.

FIG. 3 presents a perspective view of a third example apparatus 100, having another embodiment of a portion of the MEMS 102. Similar to the embodiment depicted in FIG. 1, the crystalline structural element 105 shown in FIG. 3 can have misfit dislocations 110 located at the interface 155 between the first and second crystal layers 150, 152 of the element 105. The defect sub-region 170 having such dislocations 110 remains substantially planar, while outside of the defect subregions there are bent portions 172. In this embodiment, however, the element 105 also includes edge dislocations 310 located in the single crystal layer 150. As illustrated, the misfit dislocations 110 and edge dislocations 310 can be substantially parallel to the short axis 210 of the beam-shaped crystalline structural element 105.

Edge dislocation 310 formation can be facilitated by the misfit dislocations 110 originating from nucleation sites 130. For instance, in some embodiments, the single crystal layer 150 can have a crystal orientation that is slightly tilted off a <001> direction (e.g., tilted by about 1 to 10 degrees). In such embodiments, at least some of the misfit dislocations 110 propagating from the nucleation sites 130 will tilt toward and, intersect with, each other. Some of these intersecting misfit dislocations 110 interact with each other so as to form the edge dislocation 310 that can extend into the single crystal layer 150.

Figure 4:
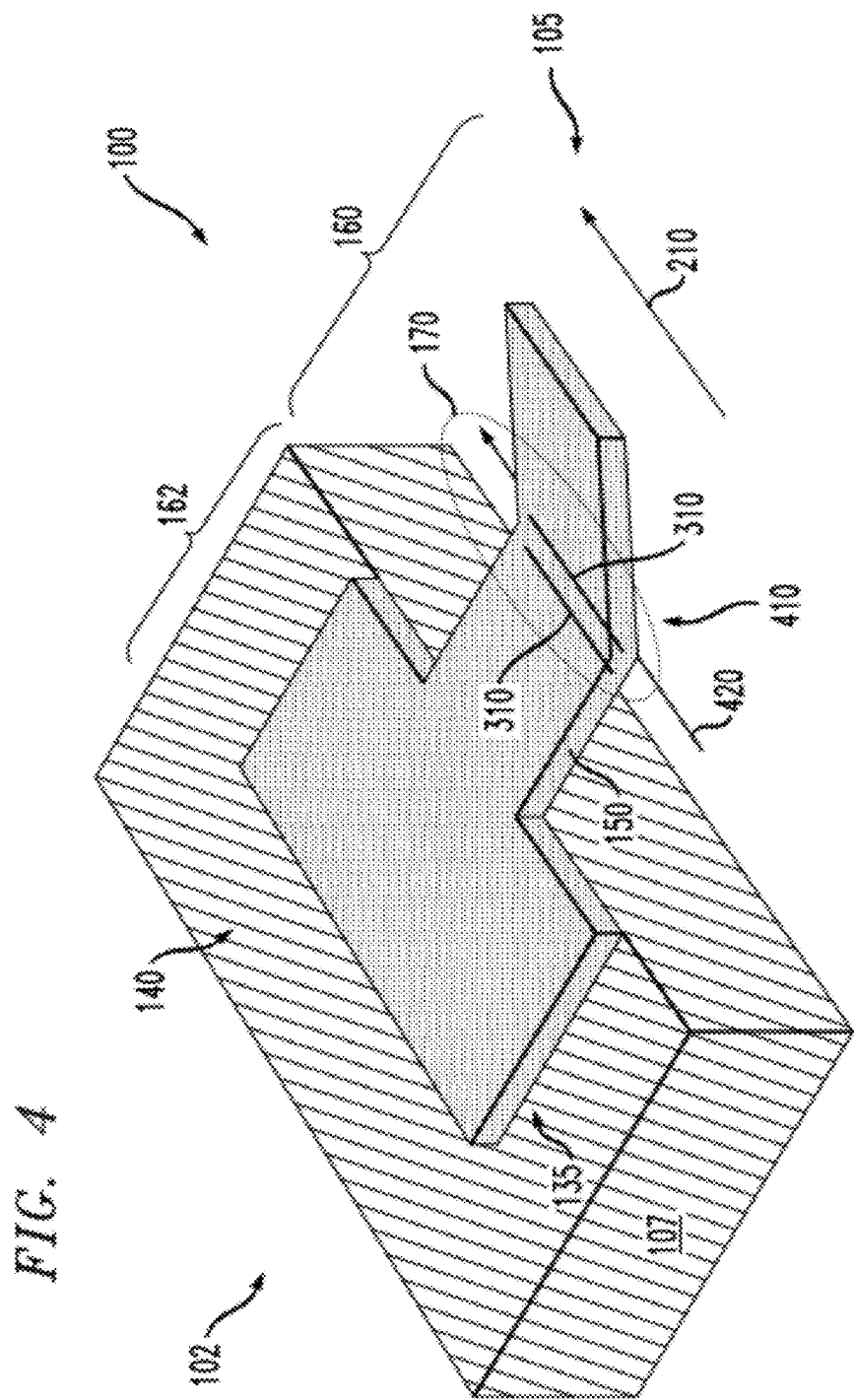
FIG. 4 presents a perspective view of a portion of a fourth example apparatus having a MEMS therein.

FIG. 4 presents a perspective view of a fourth example apparatus 100, having another embodiment of the MEMS 102. The crystalline structural element 105 in this embodiment, consists essentially of a single crystal layer 150, with edge dislocations 310 located in the single crystal layer 150. The edge dislocations run substantially traverse the width of the element 160. The embodiment in FIG. 4 is similar to the embodiment in FIG. 3 except that the second crystal layer 152 (FIG. 3) has been substantially entirely removed (e.g., greater than 99% removed) from the final MEMS 102. Consequently, the misfit dislocations 110 at the interface 155 (FIG. 3) are removed, leaving only edge dislocations 110 remaining within the element 105 (e.g., in the single or first crystal layer 150).

Analogous to the embodiment depicted in FIG. 3, the crystalline structural element 105 shown in FIG. 4 still have a defect sub-region 170, however the defects (edge dislocations 310) are in the single crystal layer 150. The crystalline structural element 105 can also have a bent portion 410. However, in contrast to the bent portions 172 for the element 105 shown in FIG. 3, the bent portion 410 is located in the defect sub-region 170 (e.g., the region with the edge dislocations). Moreover, portions of the element 105 outside of the defect sub-region 170 retains their planar shape when released, because the stresses between the two layers 150, 152 are no longer present when the second layer 152 (FIG. 3) is removed. Additionally, the bend of the bent portion 410 is in the opposite direction to the bent portions 172 shown in FIG. 3 because the remaining edge dislocations 310 in the first layer 150 are now the dominant stress producing feature in the layer 150. Consequently, to relieve such stress, the released element 105 bends at the defect sub-region 170. For example, as illustrated in FIG. 4, a bend axis 420 of the crystalline structural element 105 can be substantially parallel to the to an average direction (e.g., in the average direction of the direction vectors 115, FIG. 1) of the dislocations 310.

In other embodiments, the edge dislocations 310 can be distributed throughout the single crystal layer 105, similar that shown in FIG. 2. In such configurations, the edge dislocations 310 in the single crystal layer 150, can curl upwards to relieve stresses throughout the element 105, after releasing a part 160 of the element 105 from the substrate 107.

Nucleation sites 130 can be present in the final crystalline structural elements 105 shown in FIGS. 1, 2 and 3. In other embodiment, such as shown in FIG. 4, that portion of the crystalline structural elements 105 having the nucleation sites 130 is removed. For example, referring to FIG. 3, a portion 320 of the crystalline structural element 105 having the nucleation sites 130 can be removed, before releasing the element 105. FIG. 4 shows the resulting narrower short axis 210 nucleation site-free crystalline structural element 105, after further removing the second crystal layer 152. Similar nucleation site-free crystalline structural elements 105 could be prepared for the MEMS 102 presented in FIGS. 1 and 2.

Another aspect of the present disclosure is a method of manufacturing an apparatus. FIGS. 5-10B present perspective views of selected stages in an example method of manufacturing an apparatus 500. The method includes forming a MEMS 102 having a crystalline structural element 105. Any of the apparatuses discussed in the context of FIGS. 1-4 can be made by the method. Any process steps already discussed in the context of FIGS. 1-4 can be part of the method.

Figure 5:
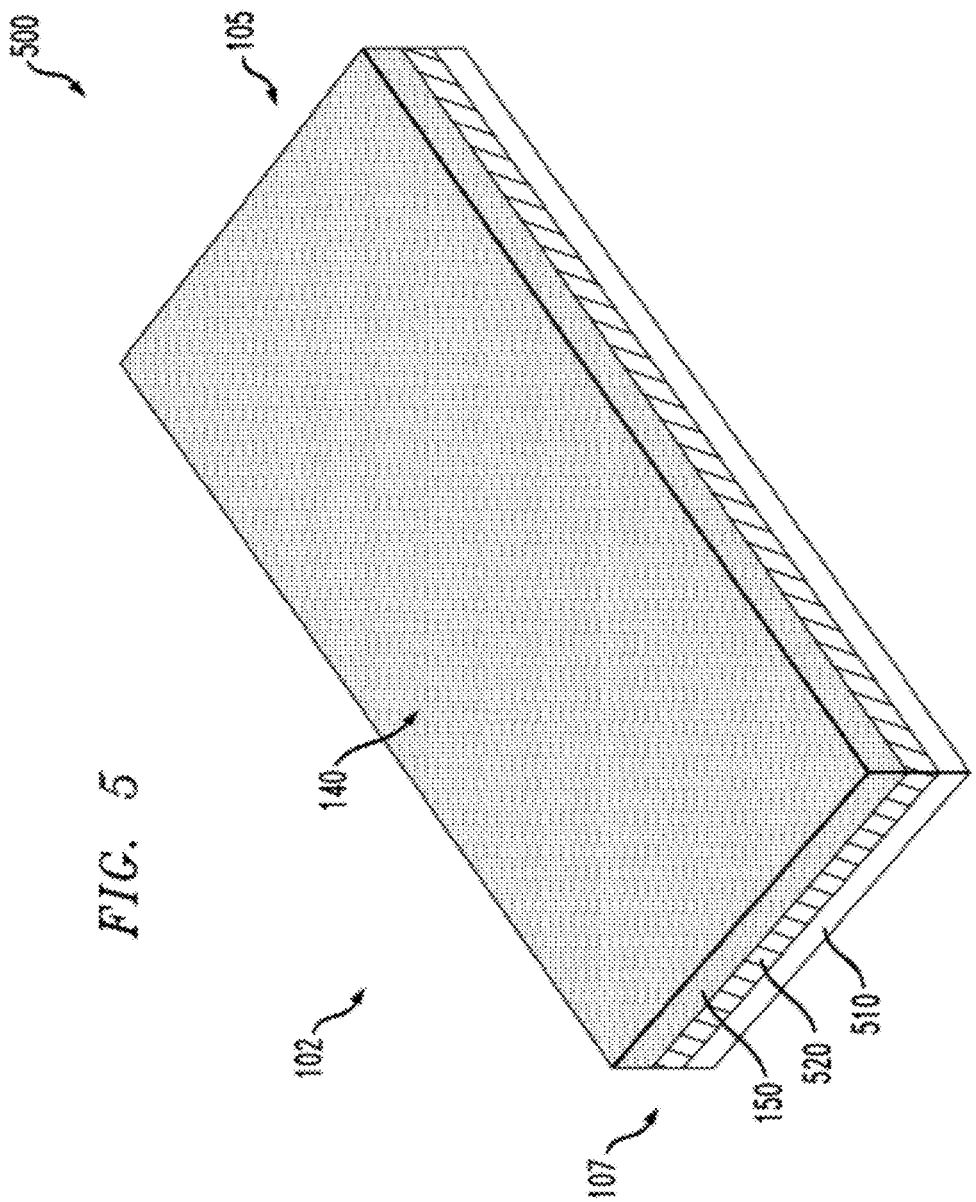
FIGS. 5-10B present perspective views of selected steps in an example method of manufacturing an apparatus, e.g., as in FIGS. 1-4.

FIG. 5 shows the apparatus 500 after providing a substrate 107 having a first crystal layer 150 located thereon. In some embodiments, the substrate 107 is a silicon-on-insulator substrate having a lower silicon layer 510, silicon oxide layer 520 and upper silicon layer that is the first crystal layer 150.

Figure 6:
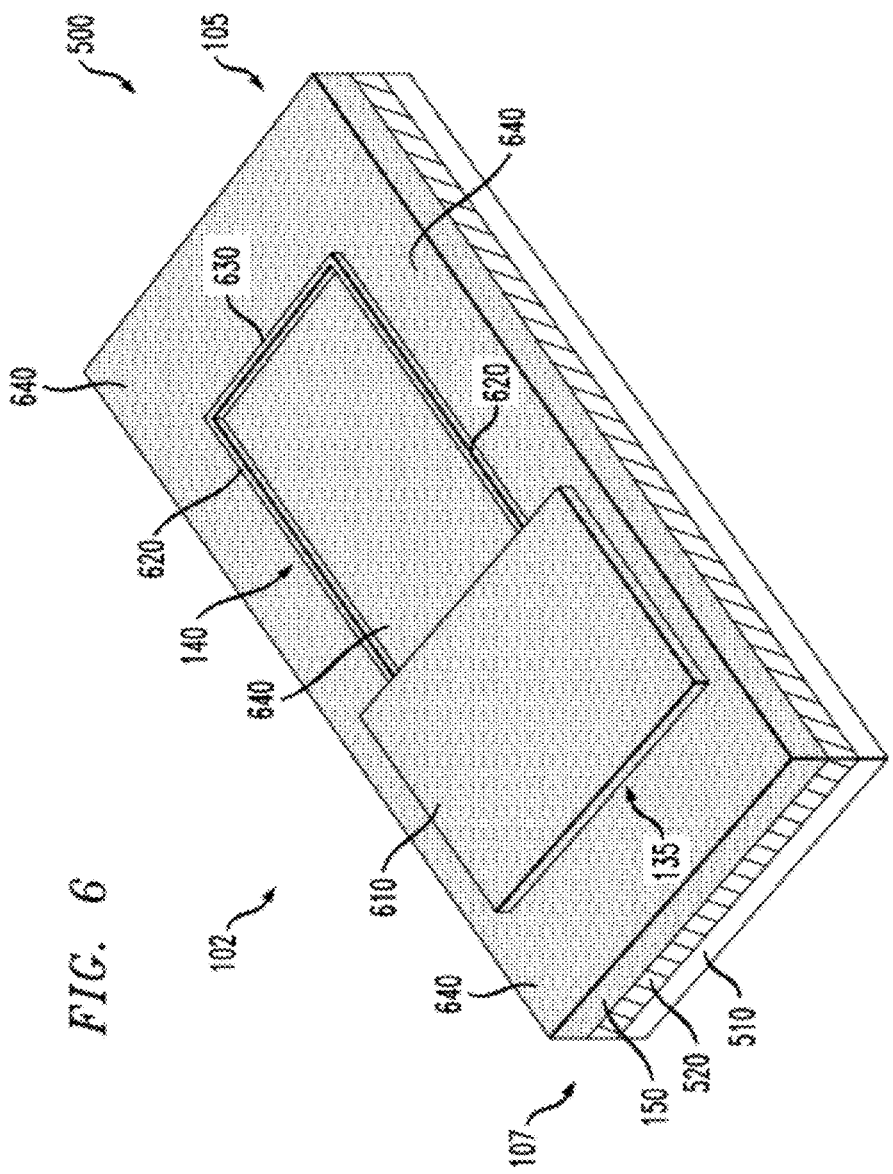

FIG. 6 shows the apparatus 500 of FIG. 5 after patterning the first crystal layer 150 to form a blocking feature 135 of the first crystal layer 150. Any conventional patterning process, such as conventional photolithographic and dry etch procedures, can be used to form the lattice dislocation blocking feature 135. For the embodiment shown in FIG. 6, the first crystal layer 150 is patterned to have a base pad 610, arms 620 coupled to the base pad 610, and a cross bar 630 that couples the two arms together. As further illustrated in FIG. 6, there can remain portions 640 of the first crystal layer 150 that lay outside of the blocking feature 135.

Figure 7:
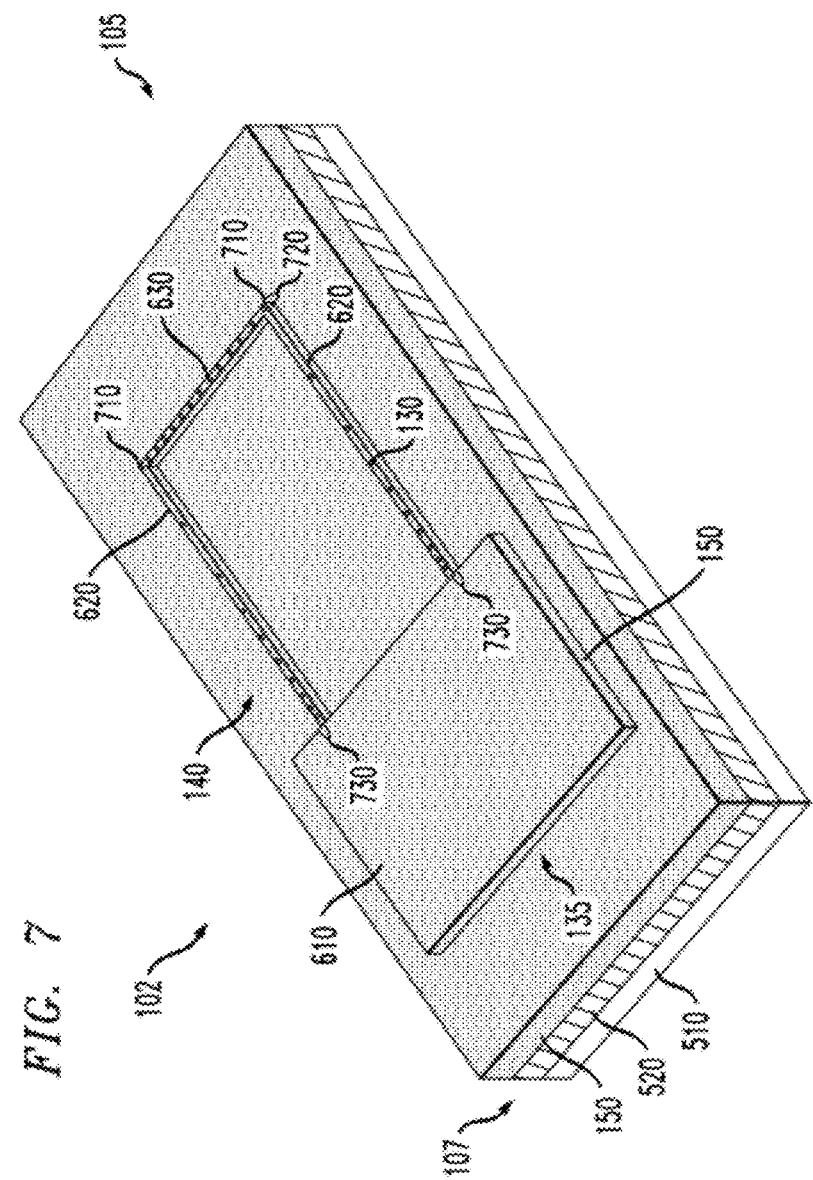

FIG. 7 shows the apparatus 500 of FIG. 6 after forming one or more nucleation sites 130 in the blocking feature 135. For example, each of the nucleation sites 130 can be formed by implanting atoms (e.g., germanium atoms) into the blocking feature 135 by conventional processes. As shown in FIG. 7, the nucleation sites 130 can be located along edges 710 of the blocking feature 135. Implanting atoms along the edges 710 can facilitate the subsequent removal of portions of the blocking features that contain the implanted atoms, if desired.

In some cases, a concentration of implanted atoms is substantially the same in all of the nucleation sites 130. In other cases, there is a progressive increasing concentration (e.g., a concentration gradient) of implanted atoms along a dimension of the blocking feature 135. For instance, as shown in FIG. 7, there is a row 720 of nucleation sites 130 along the cross bar 630. The row 720 can have a plurality of equally spaced nucleation sites 130. Each of nucleation sites 130 can have substantially the same concentration of implanted atoms. As also shown in FIG. 7, the arms 620 can each have a second row 730 with a plurality of nucleation sites 130. The density of the nucleation sites 130 can progressively increase along a dimension, for example the second rows 730, towards the base pad 610. Alternatively, equally spaced nucleation sites 130 in the second rows 730 can have progressively increasing implanted atom concentrations towards the base pad 610.

Figure 8:
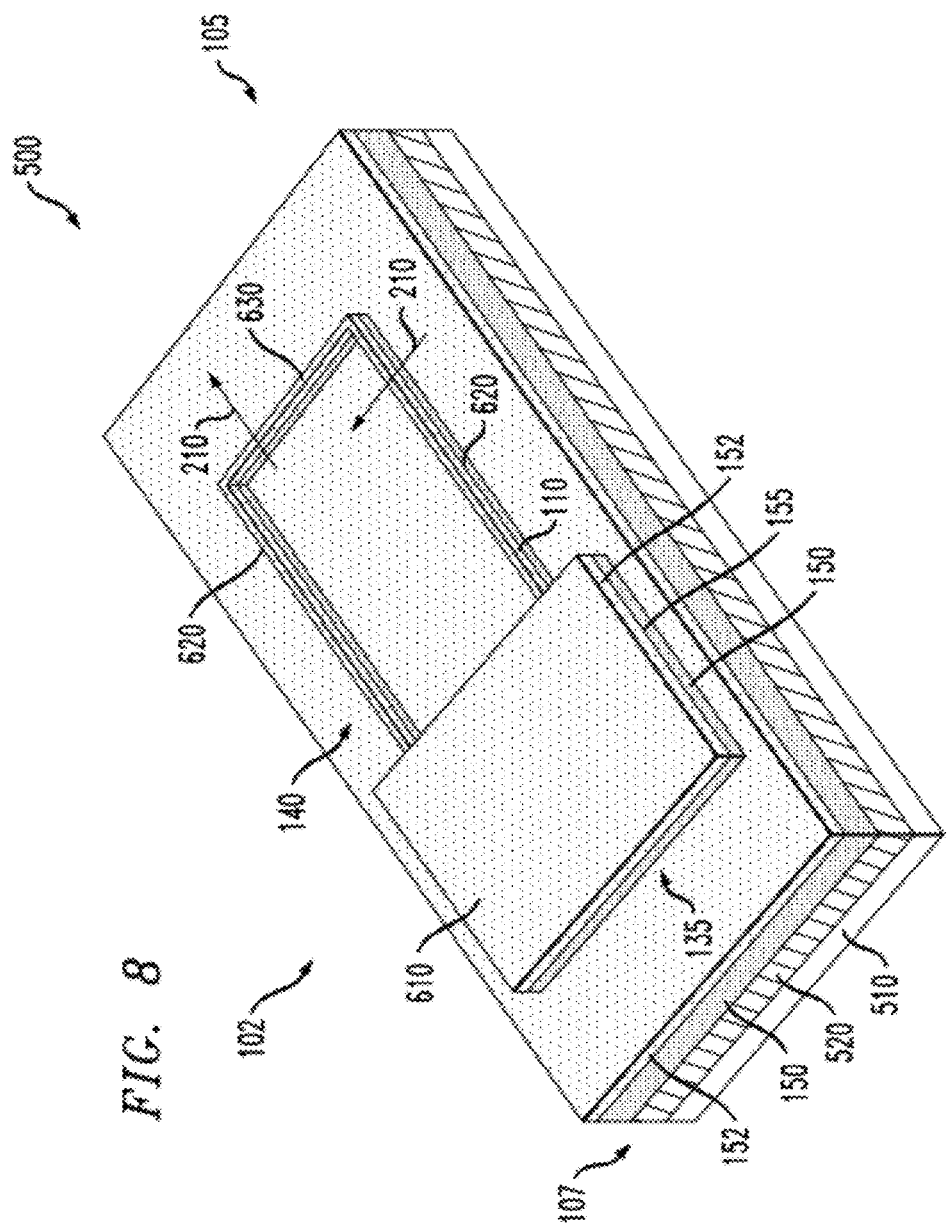

FIG. 8 shows the apparatus 500 of FIG. 7 after covering the first crystal layer 150 with a second crystal layer 152 (e.g., SiGe). The second crystal layer 152 also can cover the blocking features 135 and its nucleation sites 130 (FIG. 7). Any conventional blanket or selective deposition process such as chemical vapor deposition (CVD) or physical vapor deposition (PVD) can be used to deposit the second crystal layer 152. For example, the deposition process (e.g., vapor phase epitaxy or molecular beam epitaxy processes) may enable epitaxial growth of the second crystal layer 152.

As noted in the context of FIGS. 1-4, the compositions of the first and second layers 150, 152 are selected such that the first crystal layer 150 and the second crystal layer 152 have different bulk lattice constants (for example differing by at least about 0.1 percent). Consequently, misfit dislocations 110 form at the interface 155 between the two strained crystal layers 150, 152. A majority (for example at least about 60 percent) of the misfit dislocations 110 have direction vectors 115 (FIG. 1) that form an acute angle 120 (FIG. 1) angles of less than about 45 degrees between adjacent pairs of the misfit dislocations 110. For example, for the embodiment shown in FIG. 8, the majority of the misfit dislocations 110 can be formed along a short axis 210 of the arms 620 and the cross bar 630 of the crystalline structural element 105.

Figure 9:
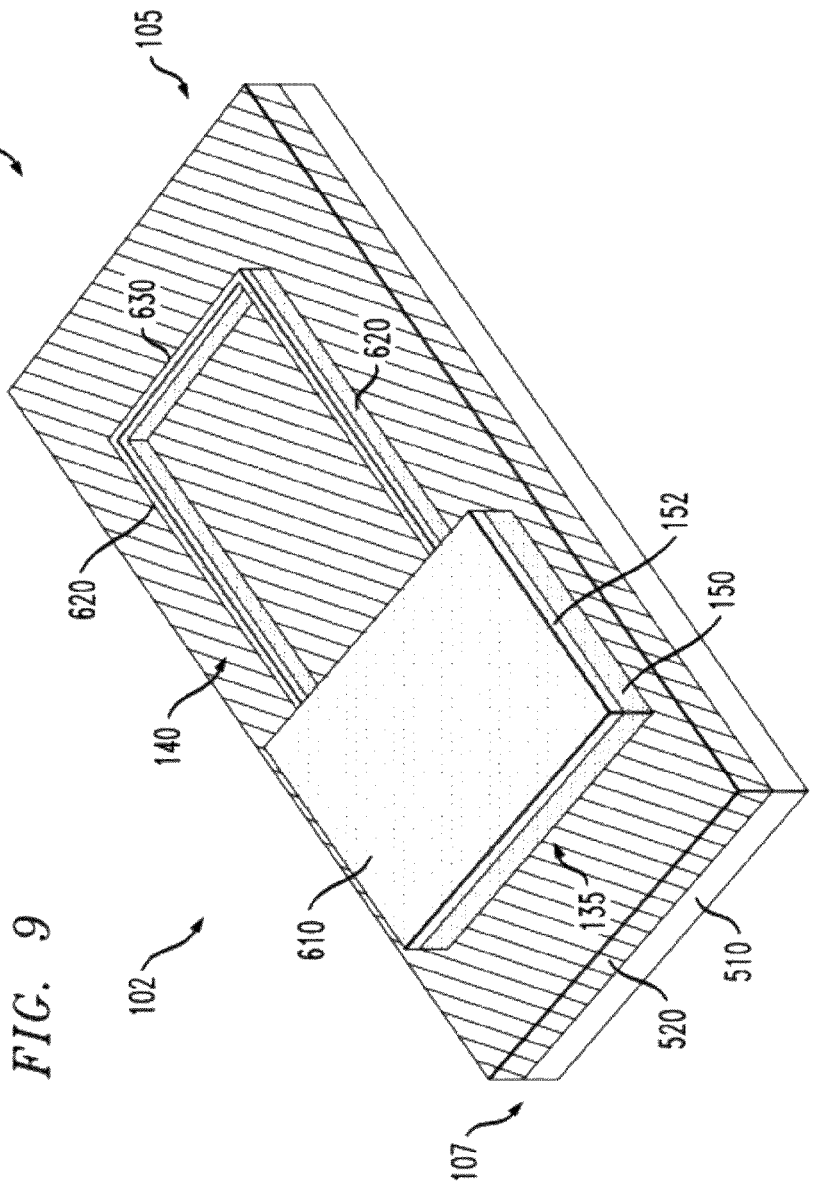

FIG. 9 shows the apparatus 500 of FIG. 8 after removing portions 640 (FIG. 6) of the first crystal layer 150 that lay outside of the blocking feature 130. Any of the conventional patterning process discussed in the context of FIG. 6 can be used to remove the portions 640 of the first crystal layer 150 that are not part of the blocking feature 135.

The same conventional patterning process may also be used to remove portion the second crystal layer 152 that lay over the outlying portions 640 of the first crystal layer 150. In other embodiments, a separate conventional patterning process can be used to remove the overlying second crystal layer 152. The conventional patterning process used to remove the outlying portions 640 can also be used to remove the nucleation sites 130 (FIG. 7) in the first crystal layer 150, and to remove the second crystal layer 152 that lay directly over the nucleation sites 130. In other embodiments, however, a separate conventional patterning process can be used to remove the nucleation sites 130. Sometimes it is desirable to remove the nucleation sites 130 because portions of the crystal layer 150 in the vicinity the nucleation sites can be sufficiently damaged to break during mechanical or thermal stresses imposed on the MEMS 102. It can also be desirable to remove the nucleation sites 130 because portions the crystal layer 150 in the vicinity of the nucleation sites can be sufficiently damaged to modify the stress distribution, and therefore, the final shape of the MEMS 102 during handling or during its intended operation. In still other cases, however, the nucleation sites 130 are not removed.

Figure 10A:
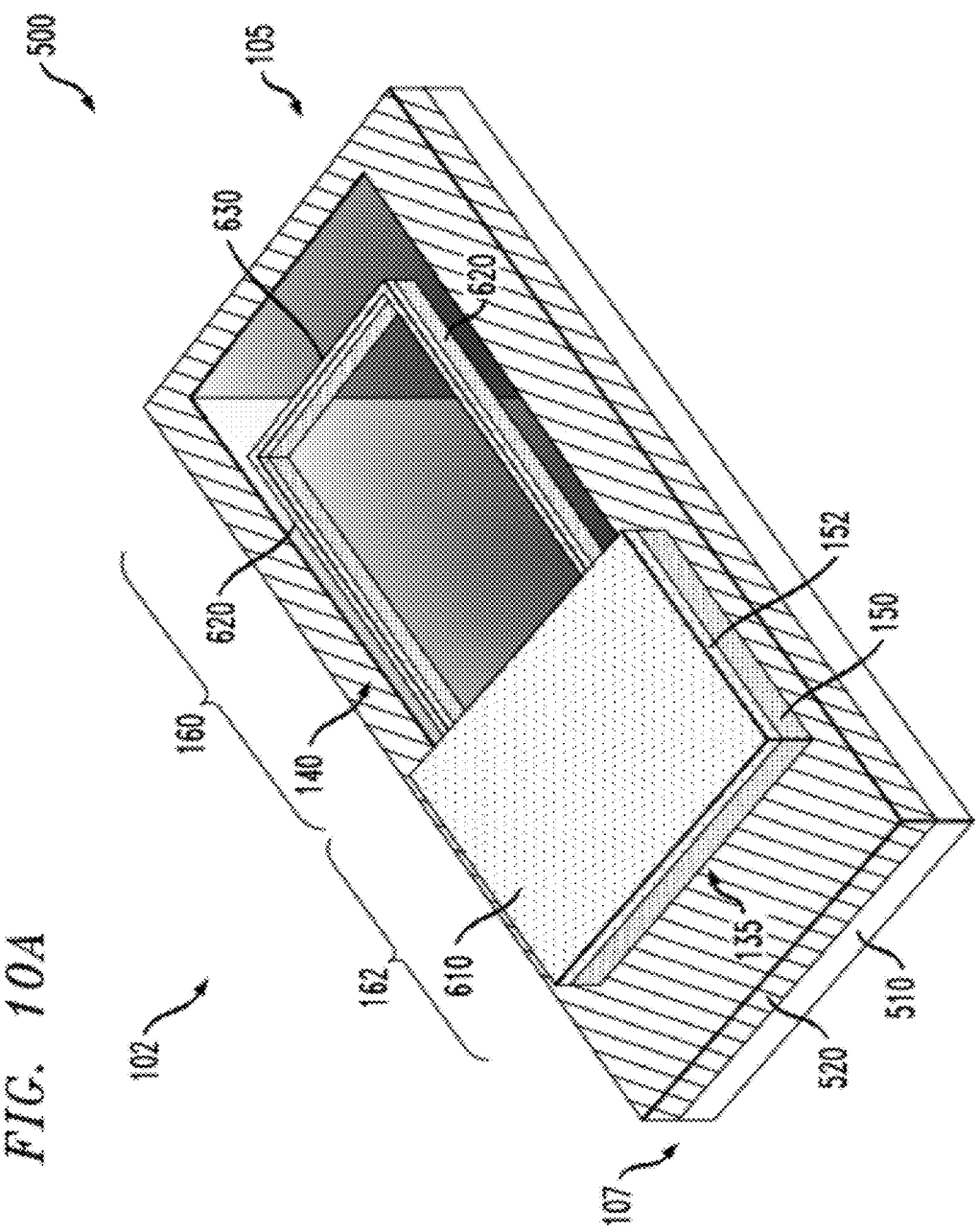

FIG. 10A shows the apparatus 500 of FIG. 9 after removing at least part of an underlying layer of the substrate 107 (e.g., one or both of the lower silicon layer 510 and silicon oxide layer 520). Any conventional process (e.g., a release etch comprising hydrofluoric acid) can be used to release a portion of the crystalline structural element 105 from the substrate 107. For the embodiment shown in FIG. 10A, the crystalline structural element 105 is released such that a first part 160 (e.g., arms 610 and cross bar 630) of the blocking feature 135 is separated from the substrate 107, while a second part 165 (e.g., base pad 610) of the blocking feature 135 remains fixed to the substrate 107. FIG. 10A shows the first part 160 of the blocking feature 135 at a transitional stage where the first part 160 has been released from the substrate 107, but the part 160 has not yet bent to relieve its stresses.

Figure 10B:
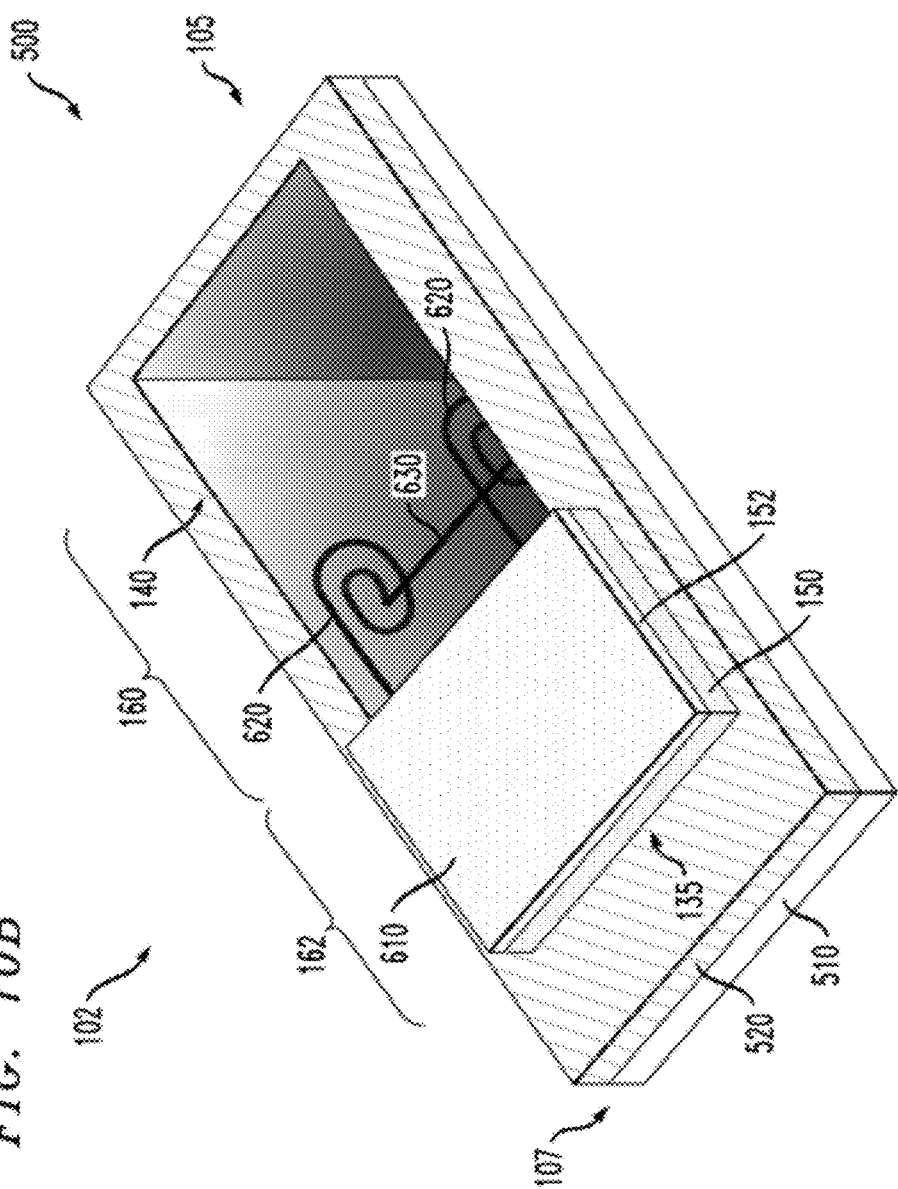

FIG. 10B shows the first part 160 of the blocking feature 135 after being released from the substrate 107 and after bending. The first part 160 has bent towards the first crystal layer 150, analogous to that depicted in FIG. 1. For the embodiment shown in FIG. 10B, the arms 620 of the first part 160 have curled. Because of the progressive increase in the nucleation sites 130 (FIG. 7) towards the base pad 610, the released arms 620 curl down to form a structural element 105 with a coiled part 160. In other embodiments, the crystalline structural element 105 can be configured to bend towards the second crystal layer 152 after being released. Such could be the case, for example, if the first crystal layer 150 is composed of silicon germanium and the second crystal layer 152 is composed of silicon or an alloy of silicon and germanium with less germanium present than in the first layer.

One skilled in the art would understand how the example manufacturing processes presented in the context of FIGS. 5-10B could be adapted to make any of the MEMS 102 shown in FIGS. 1-4. In some embodiments, for example, the nucleation sites 130 can be located such that misfit dislocations 110 are formed throughout crystalline structural element 105, similar to that shown in FIG. 2. Consequently, upon being released, the fully relaxed released part 150 of the crystalline structural element 105 can be a planar bi-crystalline layer, such as shown in FIG. 2.

In other embodiments, conventional patterning processes are used to remove the overlying second crystal layer 152 (FIG. 9), including removing substantially all of the layer 152 laying directly above the raised portions 135. The second crystal layer 152 (FIG. 9) is removed after the misfit dislocations 110 (FIG. 8) have induced the formation of edge dislocations 310 (FIG. 3). This process can be used to form embodiments such as shown in FIG. 4, where edge dislocations 310 are in the first crystal layer 110.

In some embodiments, patterning of the first crystal layer can further include forming a second blocking feature of the first crystal layer. This is illustrated in FIG. 11 for example apparatus 1100. FIG. 11 shows an alternative embodiment of the patterning step discussed above in the context of FIG. 6. In addition to patterning the first crystal layer 150 to form the blocking feature 135 (e.g., a raised feature), a second blocking feature 1105 is formed (e.g., a raised or lowered feature). The second blocking feature 1105 can be located adjacent to the nucleation site 130. FIG. 11 also shows the apparatus 1100 after forming a nucleation site 130 in the first crystal layer 150.

FIG. 12 shows the apparatus 1100 of FIG. 11 after covering the first crystal layer 150 with a second crystal layer 152. Analogous to that discussed in the context of FIG. 8, the second crystal layer 152 can cover the blocking feature 135 and second blocking feature 1105. As further illustrated in FIG. 12, the second crystal layer 152 can be selectively patterned such that it only covers certain sections of the blocking feature 135. FIG. 12 illustrates that the second blocking feature 1105 helps to guide the growth of dislocations 110 (e.g., misfit dislocations) in a particular direction. For instance, the second blocking feature 1105 can limit dislocation growth in undesired directions. As illustrated, the resulting misfit dislocations 110 can be controlled to grow parallel to the short axis 210 of the first part 160 of the element 105. The second blocking feature 1105 helps to prevent the excessive growth of misfit dislocations 110 in the fixed part 165 of the element 105. Of course, multiple first and second blocking features 135, 1100 could be formed, if desired, to further control where misfit dislocations 110 are formed.

FIG. 13 shows the apparatus 1100 of FIG. 12 after removing portions of the first crystal layer 150 that lay outside of the blocking feature 135, and the second blocking feature 1105, analogous to that presented in FIG. 9. FIG. 13 also shows the apparatus 1100 of FIG. 12 after releasing the first part 160 of the element from the substrate 107, analogous to that presented in FIGS. 10A and 10B. As shown in FIG. 13, the released first part 160 rotates out of a plane 140 of the substrate 107 around a bend axis 175 that is parallel to the direction vectors (FIG. 1) of the dislocations 110 (FIG. 12).

Although the embodiments have been described in detail, those of ordinary skill in the art should understand that they could make various changes, substitutions and alterations herein without departing from the scope of the disclosure.

What is claimed is:

1. A method of manufacturing a device, comprising:
forming a microelectromechanical system having a crystalline structural layer, including:
providing a substrate having a first crystal layer located thereon;
patterning said first crystal layer to form a lattice dislocation blocking feature;
forming one or more nucleation sites in said lattice dislocation blocking feature; and
covering said first crystal layer with a second crystal layer, wherein:
misfit dislocations form at an interface between said first crystal layer and said second crystal layer, and
at least about 60 percent of adjacent pairs of said misfit dislocations have direction vectors of said adjacent pairs form acute angles of less than about 45 degrees.

2. The method of claim 1, further including removing portions of said first crystal layer that lay outside of said lattice dislocation blocking feature, wherein said removing portions of said first crystal layer includes removing said one or more of said nucleation sites and portions of said second crystal layer lying directly above said nucleation sites.

3. The method of claim 1, further including removing at least part of an underlying layer of said substrate such that a first part of said lattice dislocation blocking feature is released from said substrate and a second part of said lattice dislocation blocking feature remains fixed to said substrate, wherein said crystalline structural layer has a suspended portion, corresponding to said first part of said lattice dislocation blocking feature, whose major or minor surface is bent.

4. The method of claim 3, wherein said suspended portion of said crystalline structural layer is bent away from said second crystal layer after said releasing.

5. The method of claim 3, wherein said suspended portion of said crystalline structural layer is bent towards said second crystal layer after said releasing.

6. The method of claim 1, wherein a concentration of implanted atoms is substantially the same in all of said nucleation sites.

7. The method of claim 1, wherein said nucleation sites are located along an edge of said lattice dislocation blocking feature.

8. The method of claim 1, wherein said nucleation sites progressively increase in said nucleation site density, or in implanted atom concentration, along a dimension of said lattice dislocation blocking feature.

9. The method of claim 1, further including entirely removing said second crystal layer after forming said misfit dislocations such that edge dislocations remain in said first crystal layer.

10. The method of claim 1, wherein said patterning of said first crystal layer includes forming a second lattice dislocation blocking feature of said first crystal layer, said second lattice dislocation blocking feature being located adjacent to said nucleation site.

11. The method of claim 1, wherein said first crystal layer and said second crystal layer have bulk lattice constants that differ by at least about 0.1 percent.

* * * * *